United States Patent [19]
Ho

[11] Patent Number: 6,088,232
[45] Date of Patent: Jul. 11, 2000

[54] DEVICE FOR QUICKLY GUIDING AND POSITIONING A MAIN PC BOARD

[76] Inventor: Hsin Chien Ho, 20F-1, No. 268, Sec. 1, Wen-Hua Road, Pan Chiao City, Taipei, Taiwan

[21] Appl. No.: 09/025,813

[22] Filed: Feb. 19, 1998

[51] Int. Cl.[7] ....................................................... H05K 5/00
[52] U.S. Cl. .......................... 361/754; 361/752; 361/753; 361/755; 361/756; 361/759; 361/788; 361/798; 361/801; 361/802; 439/377
[58] Field of Search ...................... 361/752–756, 361/759, 801, 802, 726, 727; 439/76.1, 359, 372, 377

[56] References Cited

U.S. PATENT DOCUMENTS

| | | | |
|---|---|---|---|
| 5,657,204 | 8/1997 | Hunt | 361/752 |
| 5,675,475 | 10/1997 | Mazura et al. | 361/798 |
| 5,781,417 | 7/1998 | Albani et al. | 361/801 |

*Primary Examiner*—Leo P. Picard
*Assistant Examiner*—Tuan Dinh
*Attorney, Agent, or Firm*—Dougherty & Troxell

[57] ABSTRACT

A device for quickly guiding and positioning a main PC board in which the main PC board may be quickly and firmly installed (or removed from) on a computer housing, including one or more rotatable arrow-shaped push retaining blocks screwably secured on an end edge near an opening of the computer housing, and a corresponding number of slide rails provided at an underside of the main PC board such that the main PC board may slide along the slide rails into rail slots pre-formed in the computer housing and further into a predetermined position. Prior to positioning, a projecting block at one side of a front end of the slide rail is fitted into a notch at an inner side of the push retaining block, and the push retaining block is turned to allow the main PC board to be correctly pushed into the computer housing with contact ends at one side thereof engaging with a connector of an interface card.

2 Claims, 3 Drawing Sheets

… … …

DEVICE FOR QUICKLY GUIDING AND POSITIONING A MAIN PC BOARD

BACKGROUND OF THE INVENTION (a) Field of the Invention

The present invention relates to a device for quickly guiding and positioning a main PC board, and more particularly to a device which may allow the main PC board to be quickly and firmly installed on (or removed from) the computer housing.

(b) Description of the Prior Art

Main PC boards and interface cards are indispensable standard components of personal computers in general. In order to facilitate smooth installation of the main PC board, the computer housing is designed to have an opening at one side, as that shown on the left side of the computer housing in FIG. 1, which is closable by a side plate. After the main PC board is positioned, the side plate is secured in position. In the prior art, the positioning of the main PC board is most time-consuming and troublesome. Generally, a metal housing is provided with threaded holes corresponding to pre-formed holes on the main PC board, and threaded posts are positioned in the threaded holes. Then that side of the main PC board with electrically conductive contact ends are inserted into a connector such that the pre-formed holes are aligned with the threaded posts. The screws are then tightened one by one to position the main PC board. The drawback with such prior art is that the housing has to be provided with a plurality of threaded posts, and all the screws have to be tightened or loosened when installing or removing the main PC board, which is not only time-consuming but also increases manufacturing costs. Besides, maintenance and repair are inconvenient.

SUMMARY OF THE INVENTION

Accordingly, a primary object of the present invention is to provide a device for quickly guiding and positioning a main PC board, whereby the main PC board may be quickly installed on or removed from a computer housing. The device is adapted for use on both horizontal and vertical types personal computers. According to the present invention, one or more rotatable arrow-shaped push retaining blocks are screwably secured on an end edge near an opening of a metal computer housing, and a corresponding number of slide rails are secured on an underside of the main PC board such that the main PC board may slide along the slide rails of the computer housing into predetermined positions. Prior to positioning (i.e., before the main contact ends at one side of the main PC board are inserted into the connector), projecting blocks near the front ends of the slide rails are fitted into notches of the push retaining blocks and, by turning the retaining blocks, the main PC board may be correctly pushed into position with the contact ends at one side positioned in the connector and stop blocks at the edge of the housing positioning the main PC board.

BRIEF DESCRIPTION OF THE DRAWINGS

The foregoing and other features and advantages of the present invention will be more clearly understood from the following detailed description and the accompanying drawings, in which.

DETAILED DESCRIPTION OF THE PREFERRED EMBODIMENT

Figure 1:
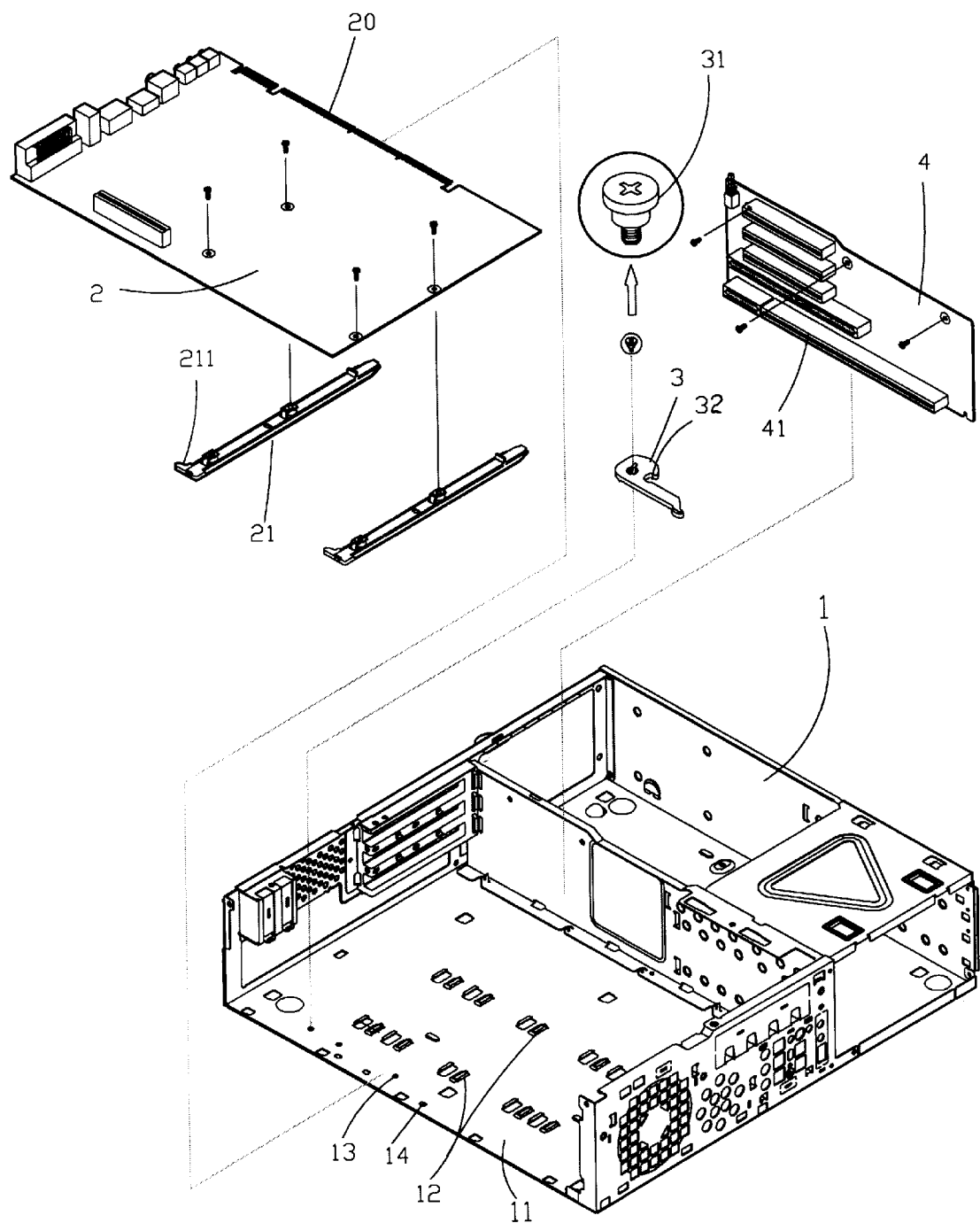
FIG. 1 is a perspective exploded view of the present invention when used on a horizontal personal computer.
Figure 2:
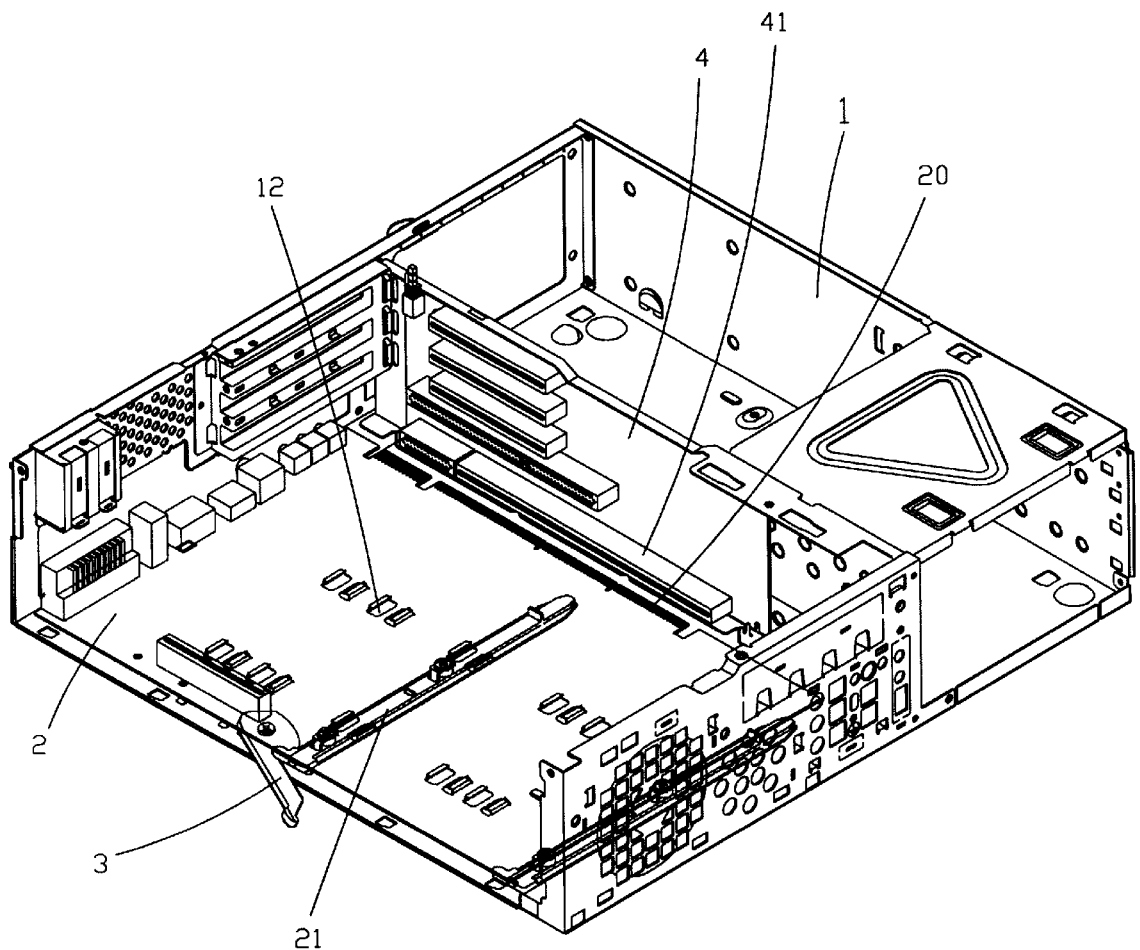
FIG. 2 is a perspective exploded view of the present invention prior to positioning of the main PC board.

With reference to FIG. 1, which shows the present invention for use on horizontal personal computers, a baseplate 11 of a metal computer housing 1 is provided with a plurality of rail slots 12. The purpose of providing a plurality of rail slots 12 is to allow main PC boards 2 of different sizes to be positioned in suitable positions according to their sizes. In addition, threaded holes 13 are provided on an end edge near an opening of the metal computer housing 1 for securing one or more rotatable arrow-shaped push retaining blocks 3 by means of two-step screws 31. An underside of the main PC board 2 has one or more slide rails 21 (according to the size of the main PC board) secured thereon. The front end of the slide rail 21 is provided with a projecting block 211 at one side.

In use, the main PC board 2 may slide along the slide rails 21 into the slide slots 12 which are pre-formed in the computer housing 1 and hence into a predetermined position. Before contact ends 20 at one side of the main PC board 2 are inserted into a connector 41 of an interface card 4, the projecting blocks 211 at the front ends of the slide rails 21 are fitted into notches 32 at the inner sides of the push retaining blocks 3. The push retaining blocks 3 are then turned so that the main PC board 2 may follow a correct direction to push into the computer housing 1, with the contact ends 20 engaging the connector 4. Besides, the main PC board 2 is also positioned by the stop blocks 14 at the edge of the computer housing 1.

To remove the main PC board 2, the push retaining block 3 is lifted lightly such that it passes over the stop block 14, and the push retaining block 3 is then turned outwardly to allow the main PC board 2 to disengage from the connector 4 and be removed.

Figure 3:
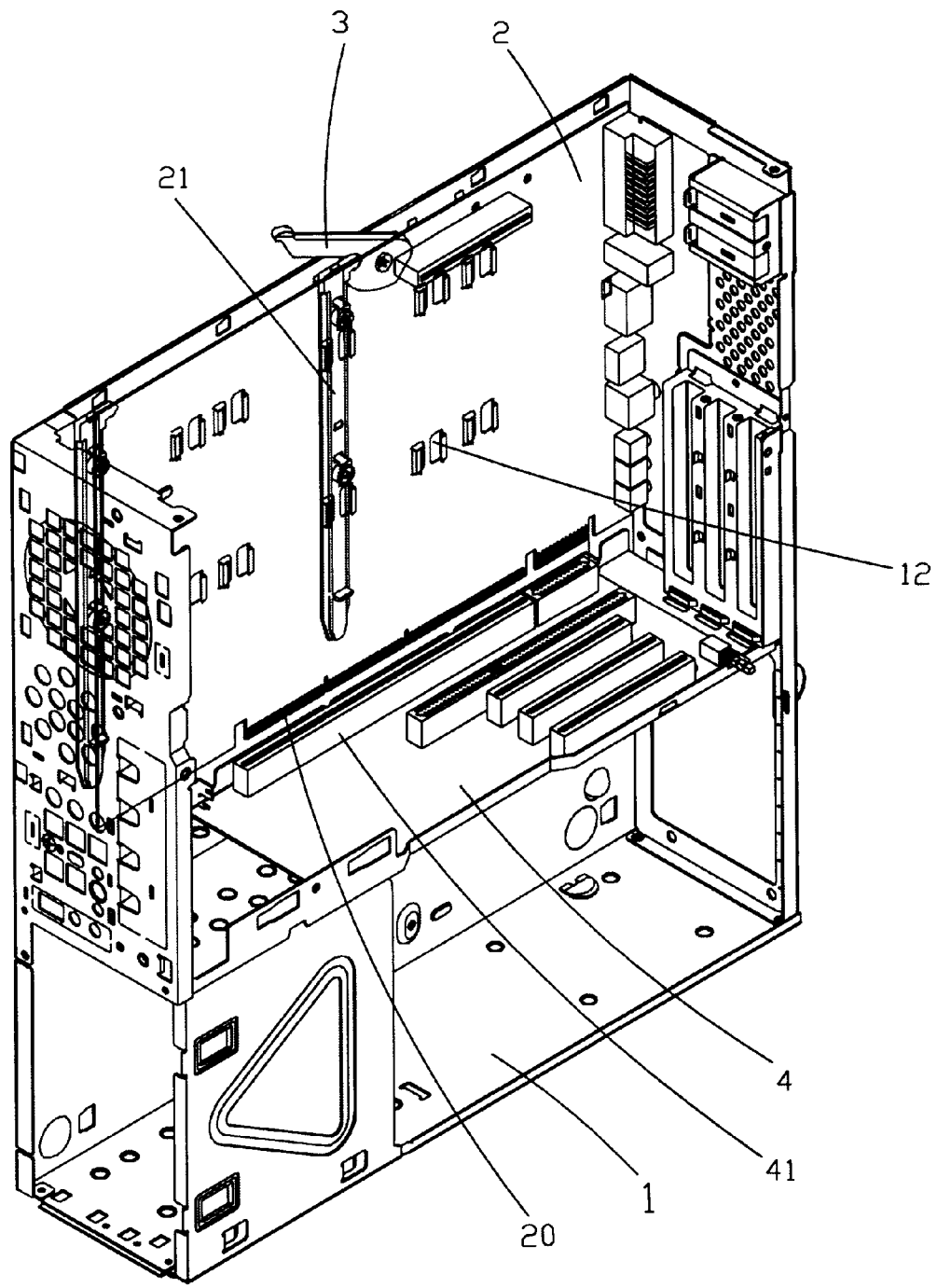
FIG. 3 is a perspective outer view of the present invention when used on a vertical personal computer.

The present invention is also adapted to be used on vertical personal computers, as shown in FIG. 3, with the main PC board 2 displacing in upward and downward directions instead of horizontally.

Although the present invention has been illustrated and described with reference to the preferred embodiment thereof, it should be understood that it is in no way limited to the details of such embodiment but is capable of numerous modifications within the scope of the appended claims.

What is claimed is:

1. A device for quickly guiding and positioning a main PC board which, when adapted comprises a plurality of rail slots provided on a baseplate of a metal computer housing, threaded holes provided on an end edge near an opening of the computer housing, one or more rotatable arrow-shaped push retaining blocks securable by two-step screws in said threaded holes, said push retaining blocks each having a notch at an inner side thereof, and one or more slide rails secured on an underside of said main PC board, each slide rail having a projecting block at one side of a front end thereof, said main PC board sliding along said slide rails into said rail slots of said computer housing and further into a predetermined position such that, before contact ends at one side of said main PC board engage with a connector of an interface card, said projecting block at said front end of said slide rail may fit into said notch at the inner side of said push retaining block and said push retaining block is turned to allow said main PC board to be quickly guided and pushed into said computer housing with said stop blocks at the edge of said computer housing ensuring the positioning, said main PC board being removable from said computer housing after disengagement from said connectors by lifting lightly said push retaining block such that it passes over said projecting block of said slide rail and by turning said push retaining block reversely.

2. The device as defined in claim 1, wherein said device is also adapted to be used on vertical personal computers, with said main PC board displacing vertically instead of horizontally.

* * * * *